US006885195B2

(12) United States Patent
Bertness

(10) Patent No.: US 6,885,195 B2
(45) Date of Patent: *Apr. 26, 2005

(54) METHOD AND APPARATUS FOR AUDITING A BATTERY TEST

(75) Inventor: Kevin I. Bertness, Batavia, IL (US)

(73) Assignee: Midtronics, Inc., Willowbrook, IL (US)

( * ) Notice: Subject to any disclaimer, the term of this patent is extended or adjusted under 35 U.S.C. 154(b) by 38 days.

This patent is subject to a terminal disclaimer.

(21) Appl. No.: 10/098,741

(22) Filed: Mar. 14, 2002

(65) Prior Publication Data

US 2003/0001579 A1 Jan. 2, 2003

Related U.S. Application Data

(60) Continuation-in-part of application No. 09/575,629, filed on May 22, 2000, now Pat. No. 6,445,158, which is a continuation-in-part of application No. 09/426,302, filed on Oct. 25, 1999, now Pat. No. 6,091,245, which is a continuation-in-part of application No. 09/293,020, filed on Apr. 16, 1999, now Pat. No. 6,351,102, which is a division of application No. 08/681,730, filed on Jul. 29, 1996, now Pat. No. 6,051,976.

(51) Int. Cl.[7] ............................................. G01R 27/26
(52) U.S. Cl. ..................................... 324/426; 340/636
(58) Field of Search .............................. 324/426, 427, 324/428, 430, 435, 436; 320/125, 134, 153, 116, 112, 106; 340/636, 637

(56) References Cited

U.S. PATENT DOCUMENTS

| 2,000,665 A | 5/1935 | Neal |
| 2,514,745 A | 7/1950 | Dalzell ........................ 171/95 |
| 3,356,936 A | 12/1967 | Smith ........................ 324/29.5 |
| 3,562,634 A | 2/1971 | Latner .............................. 31/4 |
| 3,593,099 A | 7/1971 | Scholl ........................ 320/13 |

(Continued)

FOREIGN PATENT DOCUMENTS

| DE | 29 26 716 B1 | 1/1981 |
| EP | 0 022 450 A1 | 1/1981 |

(Continued)

OTHER PUBLICATIONS

"Notification of Transmittal of the International Search Report or the Declaration" PCT/US03/07546.
Notification of Transmittal of the International Search Report along with the Search Report for International Application No. PCT/US03/27696, filed Sep. 4, 2003, date of mailing Apr. 15, 2004.

(Continued)

Primary Examiner—Rajnikant B. Patel
(74) Attorney, Agent, or Firm—Westman, Champlin & Kelly, P.A.

(57) ABSTRACT

A method and apparatus for auditing condition of a storage battery performs a battery test on the storage battery to obtain a test result. Subjective information pertaining to the battery is obtained. An audit code is generated based on the battery test result and the subjective information.

34 Claims, 4 Drawing Sheets

U.S. PATENT DOCUMENTS

| | | | |
|---|---|---|---|
| 3,607,673 A | 9/1971 | Seyl | 204/1 |
| 3,652,341 A | 3/1972 | Halsall et al. | 136/176 |
| 3,676,770 A | 7/1972 | Sharaf et al. | 324/29.5 |
| 3,729,989 A | 5/1973 | Little | 73/133 |
| 3,750,011 A | 7/1973 | Kreps | 324/29.5 |
| 3,753,094 A | 8/1973 | Furuishi et al. | 324/29.5 |
| 3,796,124 A | 3/1974 | Cross | 85/36 |
| 3,808,522 A | 4/1974 | Sharaf | 324/29.5 |
| 3,811,089 A | 5/1974 | Strezelewicz | 324/170 |
| 3,873,911 A | 3/1975 | Champlin | 324/29.5 |
| 3,876,931 A | 4/1975 | Godshalk | 324/29.5 |
| 3,886,443 A | 5/1975 | Miyakawa et al. | 324/29.5 |
| 3,889,248 A | 6/1975 | Ritter | 340/249 |
| 3,906,329 A | 9/1975 | Bader | 320/44 |
| 3,909,708 A | 9/1975 | Champlin | 324/29.5 |
| 3,936,744 A | 2/1976 | Perlmutter | 324/158 |
| 3,946,299 A | 3/1976 | Christianson et al. | 320/43 |
| 3,947,757 A | 3/1976 | Grube et al. | 324/28 |
| 3,969,667 A | 7/1976 | McWilliams | 324/29.5 |
| 3,979,664 A | 9/1976 | Harris | 324/17 |
| 3,984,762 A | 10/1976 | Dowgiallo, Jr. | 324/29.5 |
| 3,984,768 A | 10/1976 | Staples | 324/62 |
| 3,989,544 A | 11/1976 | Santo | 429/65 |
| 4,008,619 A | 2/1977 | Alcaide et al. | 73/398 |
| 4,023,882 A | 5/1977 | Pettersson | 339/96 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/29.5 |
| 4,056,764 A | 11/1977 | Endo et al. | 320/3 |
| 4,070,624 A | 1/1978 | Taylor | 327/158 |
| 4,086,531 A | 4/1978 | Bernier | 324/158 |
| 4,112,351 A | 9/1978 | Back et al. | 324/16 |
| 4,114,083 A | 9/1978 | Benham et al. | 320/39 |
| 4,126,874 A | 11/1978 | Suzuki et al. | 354/60 |
| 4,160,916 A | 7/1979 | Papasideris | 307/10 |
| 4,178,546 A | 12/1979 | Hulls et al. | 324/158 |
| 4,193,025 A | 3/1980 | Frailing et al. | 324/427 |
| 4,207,611 A | 6/1980 | Gordon | 364/580 |
| 4,217,645 A | 8/1980 | Barry et al. | 364/483 |
| 4,280,457 A | 7/1981 | Bloxham | 123/198 |
| 4,297,639 A | 10/1981 | Branham | 324/429 |
| 4,315,204 A | 2/1982 | Sievers et al. | 322/28 |
| 4,316,185 A | 2/1982 | Watrous et al. | 340/636 |
| 4,322,685 A | 3/1982 | Frailing et al. | 324/429 |
| 4,351,405 A | 9/1982 | Fields et al. | 180/65 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Backler et al. | 209/3.3 |
| 4,369,407 A | 1/1983 | Korbell | 324/416 |
| 4,379,989 A | 4/1983 | Kurz et al. | 320/26 |
| 4,379,990 A | 4/1983 | Sievers et al. | 322/99 |
| 4,390,828 A | 6/1983 | Converse et al. | 320/32 |
| 4,392,101 A | 7/1983 | Saar et al. | 320/20 |
| 4,396,880 A | 8/1983 | Windebank | 320/21 |
| 4,408,157 A | 10/1983 | Beaubien | 324/62 |
| 4,412,169 A | 10/1983 | Dell'Orto | 320/64 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,459,548 A | 7/1984 | Lentz et al. | 324/158 |
| 4,514,694 A | 4/1985 | Finger | 324/429 |
| 4,520,353 A | 5/1985 | McAuliffe | 340/636 |
| 4,620,767 A | 11/1986 | Woolf | 339/255 |
| 4,633,418 A | 12/1986 | Bishop | 364/554 |
| 4,659,977 A | 4/1987 | Kissel et al. | 320/64 |
| 4,663,580 A | 5/1987 | Wortman | 320/35 |
| 4,665,370 A | 5/1987 | Holland | 324/429 |
| 4,667,143 A | 5/1987 | Cooper et al. | 320/22 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/32 |
| 4,697,134 A | 9/1987 | Burkum et al. | 320/48 |
| 4,707,795 A | 11/1987 | Alber et al. | 364/550 |
| 4,709,202 A | 11/1987 | Koenck et al. | 320/43 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/22 |
| 4,816,768 A * | 3/1989 | Champlin | 324/428 |
| 4,820,966 A | 4/1989 | Fridman | 320/32 |
| 4,825,170 A | 4/1989 | Champlin | 324/436 |
| 4,847,547 A | 7/1989 | Eng, Jr. et al. | 320/35 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/18 |
| 4,881,038 A | 11/1989 | Champlin | 324/426 |
| 4,912,416 A | 3/1990 | Champlin | 324/430 |
| 4,913,116 A | 4/1990 | Katogi et al. | 123/425 |
| 4,926,330 A | 5/1990 | Abe et al. | 364/424.03 |
| 4,929,931 A | 5/1990 | McCuen | 340/636 |
| 4,931,738 A | 6/1990 | MacIntyre et al. | 324/435 |
| 4,933,845 A | 6/1990 | Hayes | 364/200 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/14 |
| 4,968,941 A | 11/1990 | Rogers | 324/428 |
| 4,968,942 A | 11/1990 | Palanisamy | 324/430 |
| 5,004,979 A | 4/1991 | Marino et al. | 324/160 |
| 5,032,825 A * | 7/1991 | Kuznicki | 340/636.15 |
| 5,037,778 A | 8/1991 | Stark et al. | 437/216 |
| 5,047,722 A | 9/1991 | Wurst et al. | 324/430 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,126,675 A | 6/1992 | Yang | 324/435 |
| 5,140,269 A | 8/1992 | Champlin | 324/433 |
| 5,144,218 A | 9/1992 | Bosscha | 320/44 |
| 5,144,248 A | 9/1992 | Alexandres et al. | 324/428 |
| 5,159,272 A | 10/1992 | Rao et al. | 324/429 |
| 5,160,881 A | 11/1992 | Schramm et al. | 322/7 |
| 5,170,124 A | 12/1992 | Blair et al. | 324/434 |
| 5,179,335 A | 1/1993 | Nor | 320/21 |
| 5,194,799 A | 3/1993 | Tomantschger | 320/2 |
| 5,204,611 A | 4/1993 | Nor et al. | 320/21 |
| 5,214,370 A | 5/1993 | Harm et al. | 320/35 |
| 5,214,385 A | 5/1993 | Gabriel et al. | 324/434 |
| 5,241,275 A | 8/1993 | Fang | 324/430 |
| 5,254,952 A * | 10/1993 | Salley et al. | 324/429 |
| 5,266,880 A | 11/1993 | Newland | 320/14 |
| 5,281,919 A | 1/1994 | Palanisamy | 324/427 |
| 5,281,920 A | 1/1994 | Wurst | 324/430 |
| 5,295,078 A | 3/1994 | Stich et al. | 364/483 |
| 5,298,797 A | 3/1994 | Redl | 307/246 |
| 5,300,874 A | 4/1994 | Shimamoto et al. | 320/15 |
| 5,302,902 A | 4/1994 | Groehl | 324/434 |
| 5,313,152 A | 5/1994 | Wozniak et al. | 320/6 |
| 5,315,287 A | 5/1994 | Sol | 340/455 |
| 5,321,626 A | 6/1994 | Palladino | 364/483 |
| 5,321,627 A | 6/1994 | Reher | 364/483 |
| 5,323,337 A | 6/1994 | Wilson et al. | 364/574 |
| 5,325,041 A | 6/1994 | Briggs | 320/44 |
| 5,331,268 A | 7/1994 | Patino et al. | 320/20 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/35 |
| 5,343,380 A | 8/1994 | Champlin | 363/46 |

| Patent | Date | Inventor | Class |
|---|---|---|---|
| 5,347,163 A | 9/1994 | Yoshimura | 307/66 |
| 5,352,968 A | 10/1994 | Reni et al. | 320/35 |
| 5,365,160 A | 11/1994 | Leppo et al. | 320/22 |
| 5,365,453 A | 11/1994 | Startup et al. | 364/481 |
| 5,381,096 A | 1/1995 | Hirzel | 324/427 |
| 5,412,308 A | 5/1995 | Brown | 323/267 |
| 5,412,323 A | 5/1995 | Kato et al. | 324/429 |
| 5,426,371 A | 6/1995 | Salley et al. | 324/429 |
| 5,426,416 A | 6/1995 | Jefferies et al. | 340/664 |
| 5,432,025 A | 7/1995 | Cox | 429/65 |
| 5,432,426 A | 7/1995 | Yoshida | 320/20 |
| 5,434,495 A | 7/1995 | Toko | 320/44 |
| 5,435,185 A | 7/1995 | Eagan | 73/587 |
| 5,442,274 A | 8/1995 | Tamai | 320/23 |
| 5,445,026 A | 8/1995 | Eagan | 73/591 |
| 5,449,996 A | 9/1995 | Matsumoto et al. | 320/20 |
| 5,449,997 A | 9/1995 | Gilmore et al. | 320/39 |
| 5,451,881 A | 9/1995 | Finger | 324/433 |
| 5,453,027 A | 9/1995 | Buell et al. | 439/433 |
| 5,457,377 A | 10/1995 | Jonsson | 320/5 |
| 5,469,043 A | 11/1995 | Cherng et al. | 320/31 |
| 5,485,090 A | 1/1996 | Stephens | 324/433 |
| 5,488,300 A | 1/1996 | Jamieson | 324/432 |
| 5,519,383 A | 5/1996 | De La Rosa | 340/636 |
| 5,528,148 A | 6/1996 | Rogers | 324/426 |
| 5,537,967 A | 7/1996 | Tashiro et al. | 123/792.1 |
| 5,546,317 A | 8/1996 | Andrieu | 364/481 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,572,136 A | 11/1996 | Champlin | 324/426 |
| 5,574,355 A * | 11/1996 | McShane et al. | 320/161 |
| 5,583,416 A | 12/1996 | Klang | 320/22 |
| 5,585,728 A | 12/1996 | Champlin | 324/427 |
| 5,589,757 A | 12/1996 | Klang | 320/22 |
| 5,592,093 A | 1/1997 | Klingbiel | 324/426 |
| 5,596,260 A | 1/1997 | Moravec et al. | 320/30 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/48 |
| 5,621,298 A | 4/1997 | Harvey | 320/5 |
| 5,633,985 A | 5/1997 | Severson et al. | 395/2.76 |
| 5,637,978 A | 6/1997 | Kellett et al. | 320/2 |
| 5,642,031 A | 6/1997 | Brotto | 320/21 |
| 5,650,937 A | 7/1997 | Bounaga | 364/483 |
| 5,652,501 A | 7/1997 | McClure et al. | 320/17 |
| 5,653,659 A | 8/1997 | Kunibe et al. | 477/111 |
| 5,656,920 A | 8/1997 | Cherng et al. | 320/31 |
| 5,675,234 A | 10/1997 | Greene | 320/15 |
| 5,677,077 A | 10/1997 | Faulk | 429/90 |
| 5,699,050 A | 12/1997 | Kanazawa | 340/636 |
| 5,701,089 A | 12/1997 | Perkins | 327/772 |
| 5,705,929 A | 1/1998 | Caravello et al. | 324/430 |
| 5,707,015 A | 1/1998 | Guthrie | 241/120 |
| 5,710,503 A | 1/1998 | Sideris et al. | 320/6 |
| 5,711,648 A | 1/1998 | Hammerslag | 414/786 |
| 5,717,336 A | 2/1998 | Basell et al. | 324/430 |
| 5,717,937 A | 2/1998 | Fritz | 395/750.01 |
| 5,739,667 A | 4/1998 | Matsuda et al. | 320/5 |
| 5,745,044 A | 4/1998 | Hyatt, Jr. et al. | 340/825.31 |
| 5,747,909 A | 5/1998 | Syverson et al. | 310/156 |
| 5,747,967 A | 5/1998 | Muljadi et al. | 320/39 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,772,468 A | 6/1998 | Kowalski et al. | 439/506 |
| 5,773,978 A | 6/1998 | Becker | 324/430 |
| 5,780,980 A | 7/1998 | Naito | 318/139 |
| 5,789,899 A | 8/1998 | van Phuoc et al. | 320/30 |
| 5,793,359 A | 8/1998 | Ushikubo | 345/169 |
| 5,808,469 A | 9/1998 | Kopera | 324/43.4 |
| 5,818,234 A | 10/1998 | McKinnon | 324/423 |
| 5,821,756 A | 10/1998 | McShane et al. | 324/430 |
| 5,825,174 A | 10/1998 | Parker | 324/106 |
| 5,831,435 A | 11/1998 | Troy | 324/426 |
| 5,850,113 A | 12/1998 | Weimer et al. | 307/125 |
| 5,862,515 A | 1/1999 | Kobayashi et al. | 702/63 |
| 5,865,638 A | 2/1999 | Trafton | 439/288 |
| 5,872,443 A | 2/1999 | Williamson | 320/21 |
| 5,872,453 A | 2/1999 | Shimoyama et al. | 324/431 |
| 5,895,440 A | 4/1999 | Proctor et al. | 702/63 |
| 5,914,605 A | 6/1999 | Bertness | 324/430 |
| 5,927,938 A | 7/1999 | Hammerslag | 414/809 |
| 5,929,609 A | 7/1999 | Joy et al. | 322/25 |
| 5,939,855 A | 8/1999 | Proctor et al. | 320/104 |
| 5,939,861 A | 8/1999 | Joko et al. | |
| 5,945,829 A | 8/1999 | Bertness | 324/430 |
| 5,951,229 A | 9/1999 | Hammerslag | 414/398 |
| 5,961,561 A | 10/1999 | Wakefield, II | 701/29 |
| 5,961,604 A | 10/1999 | Anderson et al. | 709/229 |
| 5,969,625 A | 10/1999 | Russo | 340/636 |
| 5,978,805 A | 11/1999 | Carson | 707/10 |
| 5,982,138 A | 11/1999 | Krieger | 320/105 |
| 6,002,238 A | 12/1999 | Champlin | 320/134 |
| 6,005,759 A | 12/1999 | Hart et al. | 361/66 |
| 6,008,652 A | 12/1999 | Theofanopoulos et al. | 324/434 |
| 6,009,369 A | 12/1999 | Boisvert et al. | 701/99 |
| 6,031,354 A | 2/2000 | Wiley et al. | 320/116 |
| 6,031,368 A | 2/2000 | Klippel et al. | 324/133 |
| 6,037,751 A | 3/2000 | Klang | 320/160 |
| 6,037,777 A | 3/2000 | Champlin | 324/430 |
| 6,037,778 A | 3/2000 | Makhija | 324/433 |
| 6,046,514 A | 4/2000 | Rouillard et al. | 367/77 |
| 6,051,976 A | 4/2000 | Bertness | 324/426 |
| 6,061,638 A | 5/2000 | Joyce | 702/63 |
| 6,064,372 A | 5/2000 | Kahkoska | 345/173 |
| 6,072,299 A | 6/2000 | Kurie et al. | 320/112 |
| 6,072,300 A | 6/2000 | Tsuji | 320/116 |
| 6,081,098 A | 6/2000 | Bertness et al. | 320/134 |
| 6,081,109 A | 6/2000 | Seymour et al. | 324/127 |
| 6,091,245 A | 7/2000 | Bertness | 324/426 |
| 6,094,033 A | 7/2000 | Ding et al. | 320/132 |
| 6,104,167 A | 8/2000 | Bertness et al. | 320/132 |
| 6,114,834 A | 9/2000 | Parise | 320/109 |
| 6,137,269 A | 10/2000 | Champlin | 320/150 |
| 6,140,797 A | 10/2000 | Dunn | 320/105 |
| 6,144,185 A | 11/2000 | Dougherty et al. | 320/132 |
| 6,150,793 A | 11/2000 | Lesesky et al. | 320/104 |
| 6,158,000 A | 12/2000 | Collins | 713/1 |
| 6,161,640 A | 12/2000 | Yamaguchi | 180/65.8 |
| 6,163,156 A | 12/2000 | Bertness | 324/426 |
| 6,172,483 B1 | 1/2001 | Champlin | 320/134 |
| 6,172,505 B1 | 1/2001 | Bertness | 324/430 |
| 6,181,545 B1 | 1/2001 | Amatucci et al. | 361/502 |
| 6,211,651 B1 | 4/2001 | Nemoto | 320/133 |
| 6,222,342 B1 | 4/2001 | Eggert et al. | 320/105 |
| 6,222,369 B1 | 4/2001 | Champlin | 324/430 |
| D442,503 S | 5/2001 | Lundbeck et al. | D10/77 |
| 6,225,808 B1 | 5/2001 | Varghese et al. | 324/426 |
| 6,236,332 B1 | 5/2001 | Conkright et al. | 340/825.06 |
| 6,238,253 B1 | 5/2001 | Qualls | 439/759 |
| 6,242,887 B1 | 6/2001 | Burke | 320/104 |
| 6,249,124 B1 | 6/2001 | Bertness | 324/426 |
| 6,250,973 B1 | 6/2001 | Lowery et al. | 439/763 |
| 6,254,438 B1 | 7/2001 | Gaunt | 439/755 |
| 6,259,170 B1 | 7/2001 | Limoge et al. | 307/10.8 |
| 6,259,254 B1 | 7/2001 | Klang | 324/427 |
| 6,262,563 B1 | 7/2001 | Champlin | 320/134 |
| 6,275,008 B1 | 8/2001 | Arai et al. | 320/132 |
| 6,294,896 B1 | 9/2001 | Champlin | 320/134 |
| 6,294,897 B1 | 9/2001 | Champlin | 320/153 |

| | | | |
|---|---|---|---|
| 6,304,087 B1 | 10/2001 | Bertness | 324/426 |
| 6,307,349 B1 | 10/2001 | Koenck et al. | 320/112 |
| 6,310,481 B1 | 10/2001 | Bertness | 324/430 |
| 6,313,607 B1 | 11/2001 | Champlin | 320/132 |
| 6,313,608 B1 | 11/2001 | Varghese et al. | 32/132 |
| 6,316,914 B1 | 11/2001 | Bertness | 320/134 |
| 6,323,650 B1 | 11/2001 | Bertness et al. | 324/426 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B1 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,356,042 B1 | 3/2002 | Kahlon et al. | 318/138 |
| 6,359,441 B1 | 3/2002 | Bertness | 324/426 |
| 6,359,442 B1 | 3/2002 | Henningson et al. | 324/426 |
| 6,363,303 B1 | 3/2002 | Bertness | 701/29 |
| 6,384,608 B1 | 5/2002 | Namaky | 324/430 |
| 6,388,448 B1 | 5/2002 | Cervas | 324/426 |
| 6,392,414 B1 | 5/2002 | Bertness | 324/429 |
| 6,396,278 B1 | 5/2002 | Makhija | 324/402 |
| 6,411,098 B1 | 6/2002 | Laletin | 324/436 |
| 6,417,669 B1 | 7/2002 | Champlin | 324/426 |
| 6,424,158 B1 | 7/2002 | Klang | 324/433 |
| 6,441,585 B1 | 8/2002 | Bertness | 320/132 |
| 6,445,158 B1 | 9/2002 | Bertness et al. | 320/104 |
| 6,526,361 B1 | 2/2003 | Jones et al. | 702/63 |
| 6,531,848 B1 | 3/2003 | Chitsazan et al. | 320/153 |
| 6,570,385 B1 | 5/2003 | Roberts et al. | 324/378 |
| 6,600,815 B1 | 7/2003 | Walding | 379/93.04 |
| 6,618,644 B1 | 9/2003 | Bean | 700/231 |
| 6,628,011 B1 | 9/2003 | Droppo et al. | 307/43 |
| 6,629,054 B1 | 9/2003 | Makhija et al. | 702/63 |
| 6,667,624 B1 | 12/2003 | Raichle et al. | 324/522 |
| 6,679,212 B1 | 1/2004 | Kelling | 123/179.28 |
| 2002/0010558 A1 | 1/2002 | Bertness et al. | 702/63 |
| 2002/0030495 A1 | 3/2002 | Kechmire | 324/427 |
| 2002/0050163 A1 | 5/2002 | Makhija et al. | 73/116 |
| 2002/0176010 A1 | 11/2002 | Wallach et al. | 348/229.1 |
| 2003/0025481 A1 | 2/2003 | Bertness | 320/155 |
| 2003/0184262 A1 | 10/2003 | Makhija | 320/130 |
| 2003/0184306 A1 | 10/2003 | Bertness et al. | 324/426 |
| 2004/0000590 A1 | 1/2004 | Raichle et al. | 235/462.01 |
| 2004/0000891 A1 | 1/2004 | Raichle et al. | 320/107 |
| 2004/0000893 A1 | 1/2004 | Raichle et al. | 320/135 |
| 2004/0000913 A1 | 1/2004 | Raichle et al. | 324/426 |
| 2004/0000915 A1 | 1/2004 | Raichle et al. | 324/522 |
| 2004/0002824 A1 | 1/2004 | Raichle et al. | 702/63 |
| 2004/0002825 A1 | 1/2004 | Raichle et al. | 702/63 |
| 2004/0002836 A1 | 1/2004 | Raichle et al. | 702/188 |
| 2004/0049361 A1 | 3/2004 | Hamden et al. | 702/115 |
| 2004/0051533 A1 | 3/2004 | Namaky | 324/426 |
| 2004/0054503 A1 | 3/2004 | Namaky | 702/183 |

FOREIGN PATENT DOCUMENTS

| | | |
|---|---|---|
| EP | 0 637 754 A1 | 2/1995 |
| EP | 0 772 056 A1 | 5/1997 |
| FR | 2 749 397 | 12/1997 |
| GB | 2 088 159 A | 6/1982 |
| GB | 2 246 916 A | 10/1990 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04131779 | 5/1992 |
| JP | 04372536 | 12/1992 |
| JP | 5216550 | 8/1993 |
| JP | 7-128414 | 5/1995 |
| JP | 09061505 | 3/1997 |
| JP | 10056744 | 2/1998 |
| JP | 11103503 A | 4/1999 |
| RU | 2089015 C1 | 8/1997 |
| WO | WO 93/22666 | 11/1993 |
| WO | WO 94/05069 | 3/1994 |
| WO | WO 98/58270 | 12/1998 |
| WO | WO 99/23738 | 5/1999 |
| WO | WO 00/67359 | 11/2000 |
| WO | WO 01/59443 | 2/2001 |

OTHER PUBLICATIONS

Operator's Manual for "Modular Computer Analyzer," SUN, Model MCA 3000, Table of Contents and pp. 1–1 to 1–2; 2–1 to 2–19; 3–1 to 3–47; 4–1 to 4–27; 5–1 to 5–18; 6–1 to 6–16; 7–1 to 7–9; 8–1 to 8–5; 9–1 to 9–13; 10–1 to 10–10; 11–1 to 11–22; 12–1 to 12–33; 13–1 to 13–2; 14–1 to 14–13 (1991).

Allen Test, Testproducts Division, "Programmed Training Course for 62–00 Series Smart Engine Analyzer," 2 page cover, Table of Contents, pp. 1–207 (1984).

"Electrochemical Impedance Spectroscopy in Battery Development and Testing", *Batteries International*, Apr. 1997, pp. 59 and 62–63.

"Battery Impedance", by E. Willihnganz et al., *Electrical Engineering*, Sep. 1959, pp. 922–925.

"Determining The End of Battery Life", by S. DeBardelaben, *IEEE*, 1986, pp. 365–368, no date.

"A Look at the Impedance of a Cell", by S. Debardelaben, *IEEE*, 1988, pp. 394–397, no date.

"The Impedance of Electrical Storage Cells", by N.A. Hampson et al., *Journal of Applied Electrochemistry*, 1980, pp. 3–11, no date.

"A Package for Impedance/Admittance Data Analysis", by B. Boukamp, *Solid State Ionics*, 1986, pp. 136–140.

"Precision of Impedance Spectroscopy Estimates of Bulk, Reaction Rate, and Diffusion Parameters", by J. Macdonald et al., *J. Electronanal, Chem.*, 1991, pp. 1–11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450–1987, Mar. 9, 1987, pp. 7–15.

"Field and Laboratory Studies to Assess the State of Health of Valve–Regulated Lead Acid Batteries: Part I Conductance/Capacity Correlation Studies", by D. Feder et al., *IEEE*, Aug. 1992, pp. 218–233.

"JIS Japanese Industrial Standard–Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18–20, 1912, paper No. 19, pp. 1–5.

"A Bridge for Measuring Storage Battery Resistance", by E. Willihncanz, *The Electrochemical Society*, preprint 79–20, Apr. 1941, pp. 253–258.

National Semiconductor Corporation, "High Q Notch Filter", 3/69, Linear Brief 5, Mar. 1969.

Burr–Brown Corporation, "Design A 60 Hz Notch Filter with the UAF42", 1/94, AB–071, 1994.

National Semiconductor Corporation, "LMF90–4$^{th}$ –Order Elliptic Notch Filter", 12/94, RRD–B30M115, Dec. 1994.

"Alligator Clips with Wire Penetrators" *J.S. Popper, Inc.* product information, downloaded from http://www.jspopper.com/, undated, no date.

"#12: LM78S40 Simple Switcher DC to DC Converter", *ITM e–Catalog*, downloaded from http://www.pcbcafe.com, undated, no date.

"Simple DC–DC Converts Allows Use of Single Battery", *Electronix Express*, downloaded from http://www.elexp.com/t_dc–dc.htm, undated, no date.

"DC–DC Converter Basics", *Power Designers*, downloaded from http://www.powederdesigners.com/InforWeb.design_center/articles/DC–DC/converter.shtm, undated, no date.

"Notification of Transmittal of The International Search Report or the Declaration", PCT/US03/07837.

* cited by examiner

METHOD AND APPARATUS FOR AUDITING A BATTERY TEST

CROSS REFERENCE TO RELATED APPLICATION

The present application claims priority from and is a continuation-in-part of U.S. patent application Ser. No. 09/575,629, filed May 22, 2000 now U.S. Pat. No. 6,445, 158, which is a Continuation-In-Part of Ser. No. 09/293,020, filed Apr. 16, 1999, now U.S. Pat. No. 6,351,102; application Ser. No. 09/575,629 is also a Continuation-In-Part of Ser. No. 09/426,302, filed Oct. 25, 1999, now U.S. Pat. No. 6,091,245; which is a Divisional of Ser. No. 08/681,730, filed Jul. 29, 1996, now U.S. Pat. No. 6,051,976, the contents of which are hereby incorporated by reference in their entirety.

BACKGROUND OF THE INVENTION

The present invention relates to testing storage batteries. More specifically, the present invention relates to generating a code related to a battery test.

Storage batteries, such as lead acid storage batteries of the type used in the automotive industry, have existed for many years. However, understanding the nature of such storage batteries, how such storage batteries operate and how to accurately test such batteries has been an ongoing endeavor and has proved quite difficult. Storage batteries consist of a plurality of individual storage cells electrically connected in series. Typically each cell has a voltage potential of about 2.1 volts. By connecting the cells in series, the voltages of the individual cells are added in a cumulative manner. For example, in a typical automotive storage battery, six storage cells are used to provide a total voltage when the battery is fully charged of 12.6 volts.

There has been a long history of attempts to accurately test the condition of storage batteries. A simple test is to measure the voltage of the battery. If the voltage is below a certain threshold, the battery is determined to be bad. However, this test is inconvenient because it requires the battery to be charged prior to performing the test. If the battery is discharged, the voltage will be low and a good battery may be incorrectly tested as bad. Furthermore, such a test does not give any indication of how much energy is stored in the battery. Another technique for testing a battery is referred as a load test. In a load test, the battery is discharged using a known load. As the battery is discharged, the voltage across the battery is monitored and used to determine the condition of the battery. This technique requires that the battery be sufficiently charged in order that it can supply current to the load.

More recently, a technique has been pioneered by Dr. Keith S. Champlin for testing storage batteries by measuring the conductance of the batteries. This technique is described in a number of United States patents obtained by Dr. Champlin, for example, U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; and U.S. Pat. No. 5,140,269, issued Aug. 18, 1992, to Champlin, entitled ELECTRONIC TESTER FOR ASSESSING BATTERY/ CELL CAPACITY.

As battery test results have become more accurate, and the repeatability of those results has increased, we have recognized a new problem. Specifically, if a subsequent battery test is performed at a later time and perhaps at a different location and under different conditions, there is no adequate way to compare the results of the two tests. It is impossible to determine if differences in test results are due to improper use of the test equipment, inaccurately recorded test results or even falsification of the test results. For example, this problem can be particularly vexing to battery manufactures, battery distributors, and automobile companies who offer warranties with their batteries. Further, the precise conditions of the test and test results would be useful in determining the cause of the failure and reducing the likelihood of failure in new batteries by identifying and correcting defects.

SUMMARY OF THE INVENTION

The present invention offers solutions to problems associated with the aforementioned problems. The present invention provides a method and apparatus for auditing a battery test. In the method, a battery test is performed on a storage battery to obtain a test result. Furthermore, the method includes obtaining subjective information pertaining to the battery. An audit code is generated based on the test result and the subjective information. Similarly, the apparatus includes battery test circuitry for performing a battery test on the storage battery and providing a test result. Input circuitry receives subjective information which pertains to the battery. Calculation circuitry coupled to the battery test circuitry and the input circuitry generates an audit code based on the battery test result and subjective information and responsively provides a code output.

In various embodiments of the invention, the code output can be used to subsequently analyze the battery test in view of the test conditions.

DETAILED DESCRIPTION OF THE PREFERRED EMBODIMENTS

The present invention provides a new and useful technique for monitoring and auditing a battery test of a storage battery, such as a lead acid storage battery. The present invention is for use with any battery tester or testing technique and those discussed herein are strictly as examples. The present invention provides a method and apparatus for combining the result of a battery test with information related to conditions of the battery test into a code which can be subsequently accessed As described herein, the present invention is useful in subsequent analysis of batteries which failed the battery test and may be used to monitor batteries returned on warranty, to monitor operator performance and can be used in detecting and identifying a faulty design of a storage battery.

Figure 1:
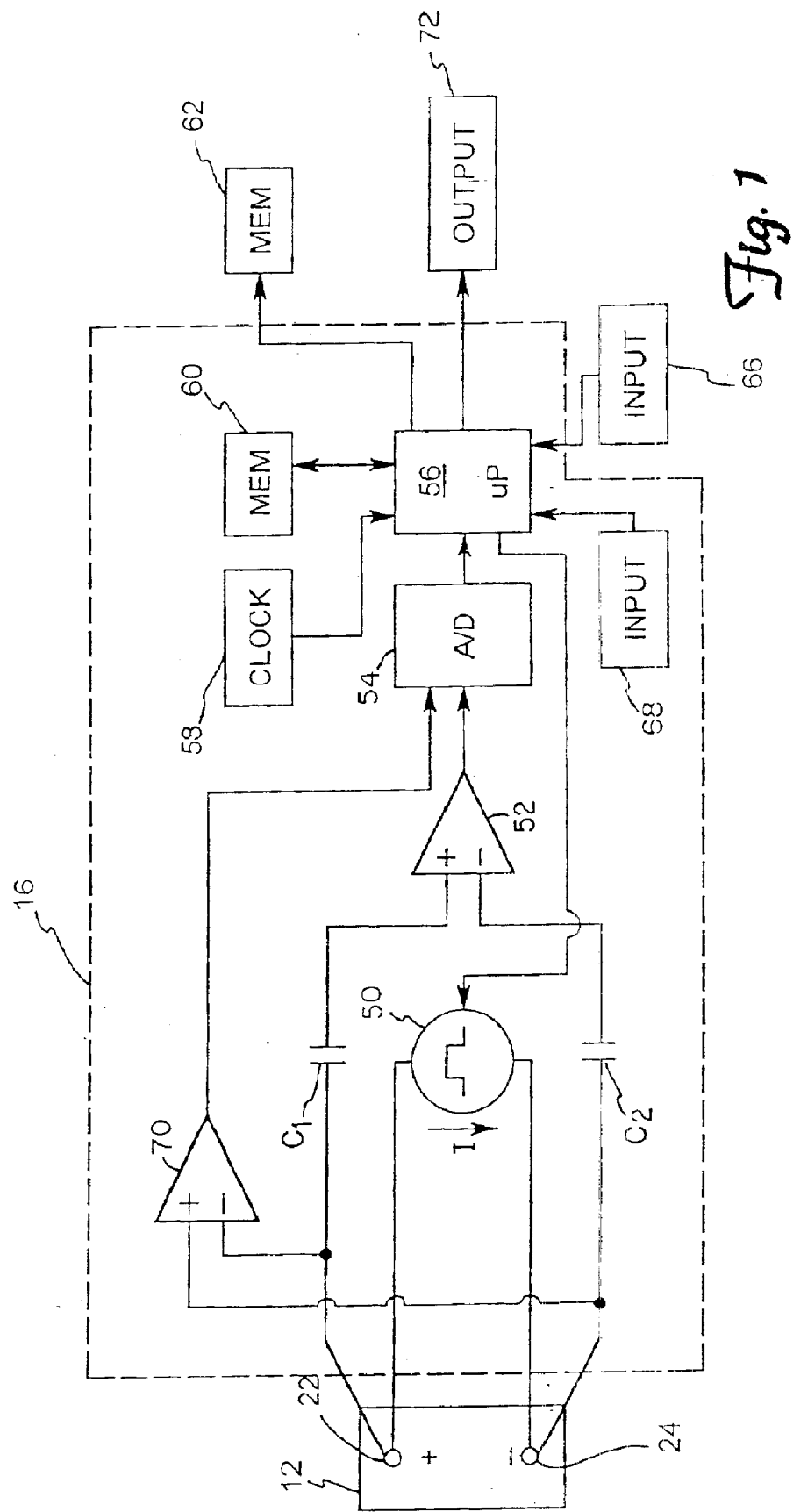
FIG. 1 is a simplified schematic diagram showing battery monitoring and auditing circuitry in accordance with the present invention.

FIG. 1 is a simplified block diagram of battery monitoring circuitry 16 in accordance with the present invention. Apparatus 16 is shown coupled to battery 12 which includes a positive battery terminal 22 and a negative battery terminal 24.

Circuitry 16 operates in accordance with one embodiment of the present invention and determines the conductance ($G_{BAT}$) of battery 12 and the voltage potential ($V_{BAT}$) between terminals 22 and 24 of battery 12. Circuitry 16 includes current source 50, differential amplifier 52, analog-to-digital converter 54 and microprocessor 56. Amplifier 52 is capacitively coupled to battery 12 through capacitors $C_1$ and $C_2$. Amplifier 52 has an output connected to an input of analog-to-digital converter 54. Microprocessor 56 is connected to system clock 58, memory 60, memory 62 and analog-to-digital converter 54. Microprocessor 56 is also capable of receiving an input from input devices 66 and 68. Microprocessor 56 also connects to output device 72.

In operation, current source 50 is controlled by microprocessor 56 and provides a current I in the direction shown by the arrow in FIG. 1. In one embodiment, this is a square wave or a pulse. Differential amplifier 52 is connected to terminals 22 and 24 of battery 12 through capacitors $C_1$ and $C_2$, respectively, and provides an output related to the voltage potential difference between terminals 22 and 24. In a preferred embodiment, amplifier 52 has a high input impedance. Circuitry 16 includes differential amplifier 70 having inverting and noninverting inputs connected to terminals 24 and 22, respectively. Amplifier 70 is connected to measure the open circuit potential voltage ($V_{BAT}$) of battery 12 between terminals 22 and 24. The output of amplifier 70 is provided to analog-to-digital converter 54 such that the voltage across terminals 22 and 24 can be measured by microprocessor 56.

Circuitry 16 is connected to battery 12 through a four-point connection technique known as a Kelvin connection. This Kelvin connection allows current I to be injected into battery 12 through a first pair of terminals while the voltage V across the terminals 22 and 24 is measured by a second pair of connections. Because very little current flows through amplifier 52, the voltage drop across the inputs to amplifier 52 is substantially identical to the voltage drop across terminals 22 and 24 of battery 12. The output of differential amplifier 52 is converted to a digital format and is provided to microprocessor 56. Microprocessor 56 operates at a frequency determined by system clock 58 and in accordance with programming instructions stored in memory 60.

Microprocessor 56 determines the conductance of battery 12 by applying a current pulse I using current source 50. The microprocessor determines the change in battery voltage due to the current pulse I using amplifier 52 and analog-to-digital converter 54. The value of current I generated by current source 50 is known and is stored in memory 60. In one embodiment, current I is obtained by applying a load to battery 12. Microprocessor 56 calculates the conductance of battery 12 using the following equation:

$$\text{Conductance} = G_{BAT} = \frac{\Delta I}{\Delta V} \qquad \text{Equation 1}$$

where $\Delta I$ is the change in current flowing through battery 12 due to current source 50 and $\Delta V$ is the change in battery voltage due to applied current $\Delta I$.

Based upon the battery conductance $G_{BAT}$ and the battery voltage, the battery tester 16 determines the condition of battery 12. For example, if the battery conductance $G_{BAT}$ is lower than a predetermined threshold for a particular battery at a particular voltage, microprocessor 56 determines that battery 12 has failed the battery test. For example, as explained in the Champlin patents, the tester can compare the measured CCA (Cold Cranking Amp) with the rated CCA for that particular battery. Microprocessor 56 uses information input from input device 66 provided by, for example, an operator. This information may consist of the particular type of battery, location, time, the name of the operator. Additional information relating to the conditions of the battery test is received by microprocessor 56 from input device 68. Input device 68 may comprise one or more sensors, for example, or other elements which provide information such as ambient or battery temperature, time, date, humidity, barometric pressure, noise amplitude or characteristics of noise in the battery or in the test result, or any other information or data which may be sensed or otherwise recovered which relates to the conditions of the test how the battery test was performed, or intermediate results obtained in conducting the test. Additional test condition information is provided by microprocessor 56. Such additional test condition information may include the values of $G_{BAT}$ and battery voltage, the various inputs provided to battery tester 16 by the operator which may include, for example, type of battery, estimated ambient or battery temperature, type of vehicle (i.e., such as provided through the Vehicle Identification Number (VIN) code for the vehicle) or the particular sequence of steps taken by the operator in conducting the test. In accordance with the present invention, microprocessor 56 uses some, or all, of the various battery test condition information and combines such test condition information with the test result to generate a code. This code is provided to output device 72 which may comprise, for example, a display or a printer. In another embodiment, the code is stored in memory 62 for subsequent use. As used herein, input circuitry refers to any circuitry used to obtain the test condition information and may include inputs 66 and 68, memory 60, etc.

The code of the present invention may be generated through any appropriate technique. Two examples follow.

For example, the display 72 will indicate:
"TEST CODE: A0XXXX1YYYY2222Z".
Where the information is encoded as follows:
A: Alphanumeric code representing geographic territory
0: 0=no temperature compensation used in conditioning the test.
  1=temperature compensation used in conditioning the test.
XXXX: Entered battery rating in coded CCA (Cold Cranking Amps) (0=A, 1=B, 2=C, etc.) I.E. "0625 CCA" displayed as AGCF
1: Result of battery test:
  0=Good—Return to Service
  1=Good—Recharge & Return to Service
  2=Recharge & Retest 3=Bad battery 4=Bad cell battery YYYY: Measured coded battery voltage without decimal point (0=A, 1=B, etc.) I.E. "12.65 Volts" displayed as BCGF 2222: Actual CCA measured by tester.

Z: Alphanumeric code representing state of charge.

An example using eight characters follows. A pseudo base 26 number, represented by two alpha characters, is used to represent certain values in this test code.

For example, to convert the coded number "CZ", look up the alpha characters in the following table:

TABLE 1

| A = 0 | B = 1 | C = 2 | D = 3 | E = 4 | F = 5 |
|---|---|---|---|---|---|
| G = 6 | H = 7 | I = 8 | J = 9 | K = 10 | L = 11 |
| M = 12 | N = 13 | O = 14 | P = 15 | Q = 16 | R = 17 |
| S = 18 | T = 19 | U = 20 | V = 21 | W = 22 | X = 23 |
| Y = 24 | Z = 25 | | | | |

Take the first letter, "C", and multiply its value by 26. Then add the value of the second letter "Z": {"C"×26}+"Z".

$$(2) \times (26) = 52 \qquad \text{Equation 2}$$

$$52 + 25 = 77 \qquad \text{Equation 3}$$

The coded number is 77.

The display 72 will indicate "TEST CODE: XX0YY1ZZ", for example.

The information is encoded as follows:

XX: Entered coded battery rating in 5 CCA increments. For example, 360 CCA would be represented as 72, 650 CCA as 130, etc. CCA will be rounded to the nearest 5 CCA value. The coded CCA is then represented using the Pseudo Base 26 scheme listed above. 360 CCA=72 coded=CU. 650 CCA=130=FA.

0: Result code:
  0=Good—Return to Service
  1=Good—Recharge & Return to Service
  2=Recharge & Retest
  3=Bad battery
  4=Bad cell battery
  5=Good—Return to Service (temperature compensated during test)
  6=Good—Recharge & Return to Service (temperature compensated during test)
  7=Recharge & Retest (temperature compensated during test)
  8=Bad battery (temperature compensated)
  9=Bad cell battery (temperature compensated)

YY: Measured coded voltage in 50 mVolt increments. For example, 10.00 volts would be represented as 200, 12.75 volts as 255, etc. Voltage will be rounded to the nearest 50 mVolt value. The coded voltage is then represented using the Pseudo Base 26 scheme listed above. 10.00 volts=200 coded=HS. 12.75 volts=255=JV.

1: Numeric code representing state of charge. The state of charge of the battery is indicated by a single numeric character. "0" represents that SOC is not applicable, such as in Replace Battery or Recharge and Retest. "5" represents 100% state of charge. "1"–"4" are divided in equal steps between a selected lower percentage and 100% relative conductance.

ZZ: Actual measured battery cranking power in 5 CCA increments. For example, 360 CCA would be represented as 72, 650 CCA as 130, etc. CCA will be rounded to the nearest 5 CCA value. The coded CCA is then represented using the Pseudo Base 26 scheme listed above. 360 CCA=72 coded=CU. 650 CCA=130=FA.

Figure 2:
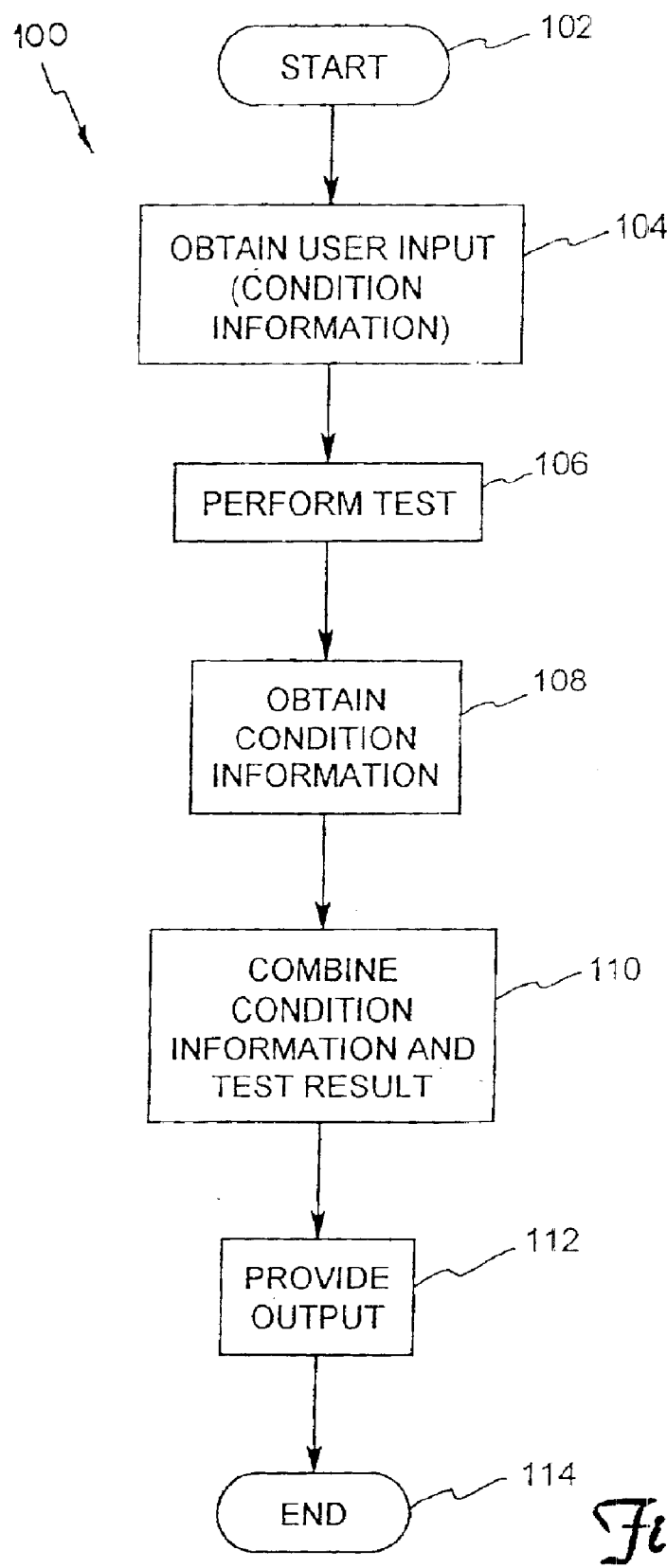
FIG. 2 is a simplified block diagram shown the steps of a method in accordance with the invention.

FIG. 2 is a simplified block diagram showing steps in accordance with the method of the present invention. FIG. 2 shows flow chart 100 which initiates operation at start block (or step) 102. At block 104, user input is obtained. For example, user input is obtained through input device 66 and may constitute instructions for performing a battery test, the rated cold cranking amps (CCA) for the batter under test, estimated temperature during the test for temperature compensation during the test or any other user input related to the test or test environment. This information is provided to microprocessor 56 and is stored in memory 60 for use during the test. Additional information may relate to a particular vehicle in which the battery in installed which may be obtained, for example, using the VIN code for the vehicle. Further, the make, model and manufacturer of the battery 12 may be provided. Other such information includes battery specific information, such as a serial number, digital signature for tracking and identifying the battery, make, model, and date of manufacture of the battery, etc. Such information may be manually input or, for example, read from a bar code carried on the battery.

At block 106, microprocessor 56 performs the battery test using the techniques described above. However, it will be understood that those techniques are merely examples and the battery test may be any battery test including a simple voltage measurement test, a load test, resistance, conductance, impedance, admittance, or other parameter test, battery capacity or state of charge test, digital hygrometer test in which the specific gravity of the battery acid is measured, complex charging and discharging tests which are known in the art, etc. It will be understood that in various embodiments of the present invention, the particular test may be selected from any available or yet to be discovered battery test.

At block 108, microprocessor 56 obtains any additional condition information which may be used in accordance with the invention. As explained above, the information may be any information related to the test such as actual ambient or battery temperature sensed by device 68, various intermediate test results which were obtained in performing the test at step 106, various battery parameters such as surface charge, voltage, conductance, resistance, float current, noise amplitude, noise frequency or other noise characteristics, etc. At step 110, microprocessor 56 combines the condition information obtained at step 108 with the test results obtained at step 106 into a string of information. The information may be of any form and is not limited to the character code described above. The information may be digitally encoded into a series of data bytes. However, in one preferred embodiment, an alpha numeric code is preferred. This combination of information is referred to herein as a code. At block 112, this code is output using an appropriate technique. For example, the code can be output on output device 72 which may be a display, printer, label printer, bar code printer, modem or other data transmission means, etc. In another variation on the invention, the step 112 provides the output to memory 62 for subsequent use. For example, a plurality of codes may be collected in memory for subsequent output or analysis. At block 114, the procedure ends.

Figure 3:
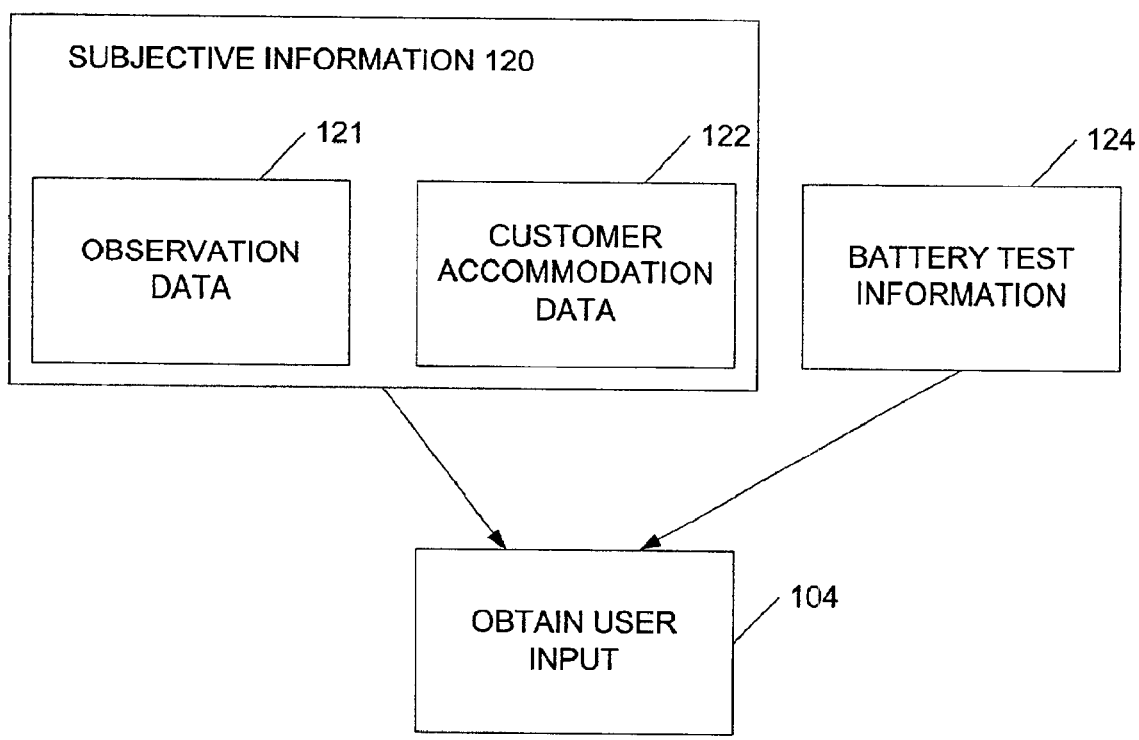
FIG. 3 is a simplified block diagram of various types of user input information.

FIG. 3 is a block diagram illustrating various types of user input information that is obtained in step 104. As described earlier, user input is obtained through input device 66, which may be for example a keyboard, keypad, microphone, scanner or the like. This user input information may be encoded as earlier described with respect to block 110. Generally, user input information includes subjective information 120 and battery test information 124.

Subjective information 120 includes both observation data 121 and customer accommodation data 122. Observation data 120 includes observations made by a person or persons pertaining to a problem or symptom with a particular battery. For example, a car owner with a battery using a car may observe that the battery does not start the car properly, or at certain times, such as in the morning. In addition, the car owner may complain that power accessories such as power windows, power mirrors, radio, etc. in the vehicle are not working properly, cause headlights to dim, or produce other problems. Various problems or symptoms relating to the battery or how the battery performs can also be provided. Alternatively, such observation data may be observed by a car technician. Other observation data may also be provided related to a physical condition of the battery. For example, terminals of the battery may be worn or the battery may have an acid leak. Observation data 121 may be chosen from a list of common problems stored on the battery tester and selected via a menu or manually input, as desired. Observation data 121 provides useful information for persons who subsequently audit the battery test.

Customer accommodation data 122 pertains to a particular customer or situation. For example, the customer accommodation data 122 is provided to indicate the accommodation of the customer's desires. Customer accommodation is particularly useful in providing top-rate service and maintaining clients. For example, a battery is replaced or returned in some instances even if the battery being replaced or returned is in proper working condition. Also, a customer may be refunded for the cost of the battery. Providing an indication of customer accommodation data 122 is useful when subsequently auditing the battery test. A manufacturer that receives a battery that has a customer accommodation indication may want to resell or reuse the battery in a different situation. The data will also assist the battery manufacturer in diagnosing problems associated with the battery.

Battery test information 124 includes any other information that is not subjective information 120. As discussed earlier, battery test information 124 information may include a VIN code, battery serial number, physical signature for tracking and identifying the battery, make, model, and date of manufacture of the battery, etc. Furthermore, this information can identify a customer, operator, dealer, time of the battery test, date of the battery test, etc. Any combination of subjective information 120, observation data 121, customer accommodation data 122 and battery test information 124 can be provided as user input information in order to obtain user input and encoded into an output.

Figure 4:
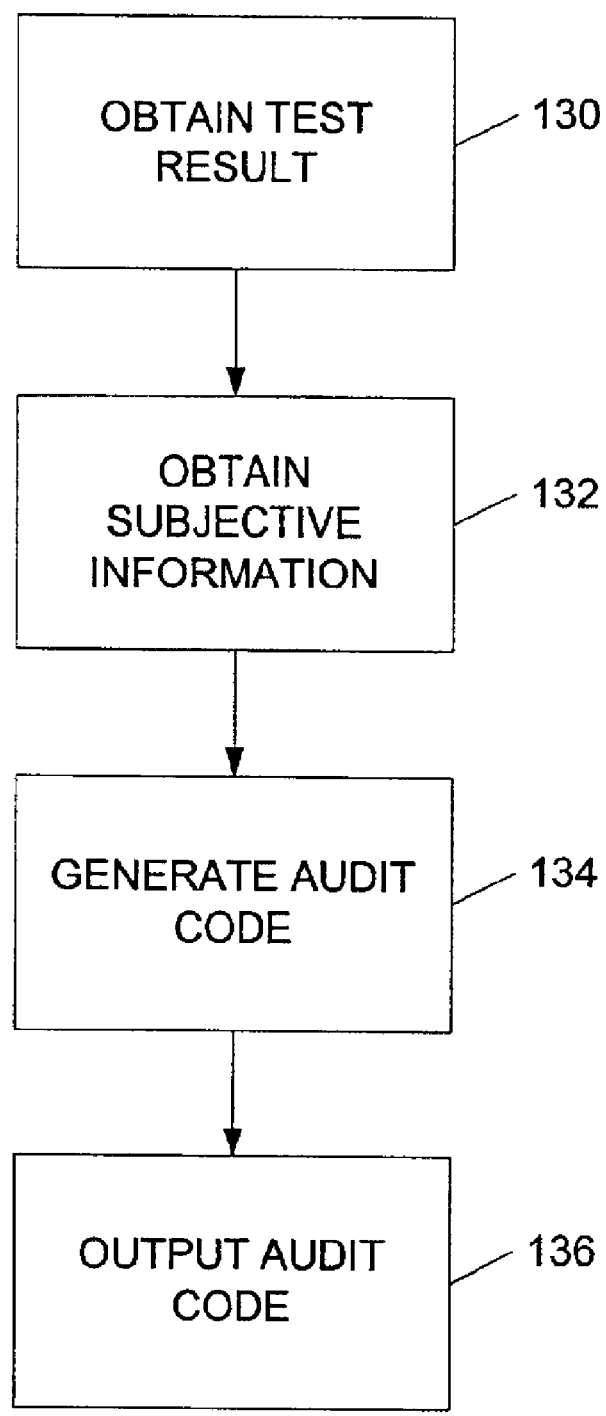
FIG. 4 is a simplified block diagram of another aspect of the present invention.

FIG. 4 illustrates a flow diagram according to another aspect of the present invention. In this flow diagram, a battery test result is obtained at 130 by performing a battery test. This can be performed using battery tester 16. Next, subjective information is obtained at step 132. As described earlier, subjective information can include observation data 121, customer accommodation data 122, or combinations thereof. If desired, battery test information 124 may also be provided via input device 66 and/or input device 68. Next, an audit code is generated at step 134. This audit code is indicative of customer accommodation data 122 and is usually generated by microprocessor 56. The code can be generated using the techniques described above or otherwise and encrypted, if desired. Then, the audit code is output at step 136. The output can be transmitted in a number of different ways to output device 72, including printed, sent via a communications network, stored on media, displayed on a screen or combinations thereof. Using the flow diagram of FIG. 4, a technician may quickly provide an audit code for a particular battery test. As a result, a technician or other person can save a considerable amount of time and include useful information such as the test result, subjective information and battery test information.

One advantage of the present invention is that it is particularly useful in ensuring compliance with the warranty return policies of manufacturers. For example, if, upon identifying a faulty battery, the operator marks the battery 12 with the code provided on output device 72, for example, by marking directly on the battery or applying a sticker to the battery when the battery is returned, the manufacturer will have information regarding the test which resulted in the return of the battery. In one preferred embodiment, the code is encrypted or otherwise difficult to duplicate whereby the code cannot be falsified. Thus, the manufacturer may then perform a subsequent test on the battery and compare the subsequent test result with the result obtained which lead to the warranty return. This will make it very difficult for the unscrupulous individual to return a battery under a warranty policy where the battery is not faulty. Furthermore, the invention provides additional traceability of the batteries which are being returned to the manufacturer in that the particular code may contain geographic and location information used to identify the particular test location and operator which lead to the failed test. Further still, if the battery is in a new car and is being returned to the automobile manufacturer, the manufacturer can retrieve information regarding the vehicle such as through the VIN code of the vehicle.

The present invention provides a convenient technique for a manufacturer to collect information regarding batteries which fail battery tests. Such information can be used in improving future batteries or identifying faults in existing batteries. For example, the code can contain information regarding the various intermediate steps or measurements which are obtained in providing the battery test. This could be, for example, battery recovery voltage, voltage after a first test, voltage after a second test, surface charge voltage, voltage or current in response to an implied load or signal, temperature compensation input, noise amplitude or other noise characteristics, float current, etc. Further, observation data in the code provides manufactures an easy way to identify problems with faulty batteries, for example ignition problems with car batteries. Further still, manufacturers can easily identify batteries where the customer has been accommodated.

The present invention may be used with standby batteries such as those used to power remote telephone switching locations, computer facilities, power company facilities, pumping stations, etc. It will be understood by those skilled in the art that the present invention is not limited to automotive storage batteries.

In one embodiment of the invention, the code is in an encrypted format to thereby reduce the likelihood of code falsification. In the examples described above, the code is encrypted in that it is difficult for a user who is unfamiliar with the particular coding technique to discover the precise technique being used and generate valid codes which contain falsified information. A further embodiment of the invention includes providing a stronger encryption algorithm which may be as simple as an offset or transposition cipher or a more complex technique such as a public key encryption technique. Such a technique can also be used to apply a digital signature to the code containing, for example, information about the particular battery tester being used.

Although the present invention has been described with reference to preferred embodiments, workers skilled in the art will recognize that changes may be made in form and detail without departing from the spirit and scope of the invention. For example, one may use other input mechanisms to obtain test condition information or employ other battery tests than those explicitly described. Further, the code may be generated using any appropriate technique.

What is claimed is:

1. A method of monitoring the condition of a storage battery, comprising:

performing a battery test on the storage battery and obtaining a test result;

obtaining subjective information pertaining to the battery wherein the subjective information relates to observations made by an operator; and generating an encrypted code based on the test result and the subjective information.

2. The method of claim 1 wherein obtaining subjective, information comprises obtaining observation data pertaining to a problem with the battery and generating the encrypted code based on the observation data.

3. The method of claim 2 wherein the problem relates to a vehicle containing the battery.

4. The method of claim 2 wherein the problem relates to a physical condition of the battery.

5. The method of claim 2 wherein the problem is observed by a technician.

6. The method of claim 2 wherein the problem is observed by a customer using the battery.

7. The method of claim 1 wherein obtaining subjective information comprises obtaining an indication of customer accommodation and generating the encrypted code based on the indication.

8. The method of claim 1 and further comprising obtaining battery test related to conditions of the battery test and generating the encrypted code based on the battery test information.

9. The method of claim 8 wherein the battery test information includes a name of the operator performing the battery test.

10. The method of claim 8 wherein the battery test information includes a location of the dealer performing the battery test.

11. The method of claim 8 wherein the battery test information includes information related to a vehicle containing the battery.

12. The method of claim 8 wherein the battery test information includes obtaining temperature information.

13. The method of claim 8 wherein the battery test information includes rated battery Cold Cranking Amps (CCA).

14. The method of claim 1 wherein performing a battery test includes determining battery conductance.

15. The method of claim 1 wherein performing a test includes applying an electrical load to the battery.

16. The method of claim 1 wherein the encrypted code comprises an alpha numeric code.

17. The method of claim 1 including placing the encrypted code on the battery.

18. The method of claim 1 and further comprising obtaining battery test information and wherein obtaining subjective information comprises obtaining observation data and an indication of customer accommodation, and generating the encrypted code based on the battery test information.

19. An electronic battery tester configured to generate the encrypted code in accordance with the method of claim 1.

20. An apparatus for monitoring the condition of a storage battery, comprising:

battery test circuitry for performing a battery test on the storage battery and providing a battery test result;

input circuitry receiving subjective information pertaining to the battery, wherein the subjective information relates to observations made by an operator; and calculation circuitry coupled to the battery test circuitry and the input circuitry and generating an encrypted code based on the battery test result and the subjective information.

21. The apparatus of claim 20 wherein the subjective information comprises observation data pertaining to a problem with the battery and the calculation circuitry generates the encrypted code based on the observation data.

22. The apparatus of claim 21 wherein the problem relates to a vehicle containing the battery.

23. The apparatus of claim 21 wherein the problem relates to a physical condition of the battery.

24. The apparatus of claim 21 wherein the problem is observed by a technician.

25. The apparatus of claim 21 wherein the problem is observed by a customer using the battery.

26. The apparatus of claim 20 wherein the subjective information comprises an indication of customer accommodation and the calculation circuitry generates the encrypted code based on the indication.

27. The apparatus of claim 20 wherein the input circuitry further receives battery test information related to conditions of the battery test and the calculation circuitry generates the encrypted code based on the battery test information.

28. The apparatus of claim 27 wherein the battery test information includes a name of the operator performing the battery test.

29. The apparatus of claim 27 wherein the battery test information includes a location of the dealer performing the battery test.

30. The apparatus of claim 27 wherein the battery test information includes information related to a vehicle containing the battery.

31. The apparatus of claim 27 wherein the battery test information includes temperature information.

32. The apparatus of claim 27 wherein the battery test information includes rated battery Cold Cranking Amps (CCA).

33. The apparatus of claim 20 wherein the battery test circuitry includes means for determining battery conductance.

34. The apparatus of claim 20 wherein the battery test circuitry includes means for applying an electrical load to the battery.

* * * * *